(12) United States Patent
Kim et al.

(10) Patent No.: US 7,190,432 B2
(45) Date of Patent: Mar. 13, 2007

(54) EXPOSURE APPARATUS

(75) Inventors: Sang Gi Kim, Daejeon (KR); Ju Wook Lee, Daejeon (KR); Jong Moon Park, Daejeon (KR); Seong Wook Yoo, Daegu (KR); Kun Sik Park, Daejeon (KR); Yong Sun Yoon, Daejeon (KR); Yoon Kyu Bae, Daejeon (KR); Byung Won Lim, Daejeon (KR); Jin Gun Koo, Daejeon (KR); Boo Woo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 28 days.

(21) Appl. No.: 11/249,783
(22) Filed: Oct. 13, 2005

(65) Prior Publication Data

US 2006/0109444 A1    May 25, 2006

(30) Foreign Application Priority Data

Nov. 24, 2004    (KR)    ...................... 10-2004-0096680

(51) Int. Cl.
  *G03B 27/32* (2006.01)
  *G03B 27/42* (2006.01)
  *G03B 27/70* (2006.01)
  *G03B 27/54* (2006.01)
(52) U.S. Cl. ............................. 355/26; 355/53; 355/66; 355/67
(58) Field of Classification Search .................. 355/26, 355/53, 66, 67
See application file for complete search history.

(56) References Cited

U.S. PATENT DOCUMENTS

| | | | |
|---|---|---|---|
| 4,967,088 A | 10/1990 | Stengl et al. | |
| 5,923,403 A | 7/1999 | Jain | |
| 6,094,305 A | 7/2000 | Shiraishi | |
| 6,211,942 B1 * | 4/2001 | Okamoto | ...................... 355/26 |
| 6,229,595 B1 | 5/2001 | McKinley et al. | |
| 6,700,642 B2 | 3/2004 | Mori et al. | |

FOREIGN PATENT DOCUMENTS

WO    WO 9611376    4/1996

* cited by examiner

*Primary Examiner*—Alan Mathews
(74) *Attorney, Agent, or Firm*—Ladas & Parry LLP

(57) ABSTRACT

Provided is a wafer exposure apparatus used in a semiconductor device manufacturing process, the exposure apparatus including: a reflective mirror for reflecting light provided from a light source; an optical path changer for changing a path of the light provided from the reflective mirror; first mirrors installed at both sides of the optical path changer to change the path of the light; second mirrors installed at both sides of a material to change the path of the light; and third mirrors installed at both sides of a mask to enter the light reflected by the first mirrors to the mask and to enter the light passed through the mask into the second mirrors, whereby it is possible to continuously expose one surface, both surfaces or a specific surface of a wafer in a state that the wafer is once aligned.

8 Claims, 2 Drawing Sheets

EXPOSURE APPARATUS

CROSS-REFERENCE TO RELATED APPLICATION

This application claims the benefit of Korean Patent Application No. 2004-96680, filed Nov. 24, 2004, the disclosure of which is hereby incorporated herein by reference in its entirety.

BACKGROUND

1. Field of the Invention

The present invention relates to a wafer exposure apparatus used in a semiconductor device manufacturing process, and more particularly, to an exposure apparatus capable of continuously exposing front and rear surfaces, or a specific surface, in a state that a wafer is aligned to the exposure apparatus.

2. Discussion of Related Art

Generally, in order to form a predetermined pattern on a wafer (sample) in a semiconductor device manufacturing process, after forming a predetermined layer, the predetermined layer is patterned through photolithography and etching processes. At this time, the photolithography process includes exposure and development processes for forming a pattern using a photosensitive layer.

The exposure process is a process of exposing the photosensitive layer using a predetermined mask, after mounting the wafer having the photosensitive layer on an exposure apparatus, which is classified into a contact alignment method of exposing the wafer and the mask in direct contact with each other, a proximity alignment method of exposing the mask and the wafer spaced apart from each other, and a stepper alignment method of repeatedly exposing a fine pattern or a precise pattern, depending on the type of the exposure apparatus.

FIG. 1 is a schematic view of a conventional exposure apparatus using a proximity alignment method, and light provided form a light source 1 is reflected by a reflective mirror 2 to be collected to a mirror 3. The light reflected by the mirror 3 progresses through an optical system formed of a plurality of lenses, re-reflected by a mirror 5, and then irradiated to a wafer 8 fixed to a holder or a chuck 9 through a lens 6. At this time, the light selectively passes through a mask 7 disposed on the wafer 8 and having a pattern to exposure only a desired portion of the photosensitive layer.

The conventional exposure apparatus is configured to expose only one surface of the wafer in a state that the wafer is approximately horizontally aligned, and in the case of exposing the other surface of the wafer, the wafer should be re-mounted. Therefore, since the wafer should be detached in order to expose the other surface of the wafer, it may be troublesome to perform the increased number of processes, and a rear surface of the wafer may be damaged (marked) due to scratch of the wafer in contact with the chuck while the wafer is attached or detached. In particular, the processed wafer has a step to make it difficult to mount the wafer on the chuck, the processed surface of the wafer may be damaged, and an alignment error may also be generated.

SUMMARY OF THE INVENTION

The present invention is directed to a wafer exposure apparatus capable of continuously and easily exposing one surface, both surfaces, or a specific surface of a wafer in a state that the wafer is once aligned.

One aspect of the present invention is to provide an exposure apparatus including: a light source; a mask having a predetermined pattern; a material mounted on a holder to be exposed; a reflective mirror for reflecting light provided from the light source; an optical path changer for changing a path of the light provided from the reflective mirror; first mirrors installed at both sides of the optical path changer to change the path of the light; second mirrors installed at both sides of the material to change the path of the light; and third mirrors installed at both sides of the mask to enter the light reflected by the first mirrors and to enter the light passed through the mask into the second mirrors.

The exposure apparatus may further include lenses installed between the mask and the third mirrors, respectively, further includes rotary means for rotating the optical path changer to change the optical path, and further includes a rotary means for rotating the third mirrors to enter the light reflected by the first mirrors into the mask or to enter the light passed through the mask into the second mirrors.

The optical path changer may be composed of a mirror or a beam splitter having one reflective surface or a pair of reflective surfaces, each of the first and second mirrors has one reflective surface, and each of the third mirrors has a pair of reflective surfaces.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
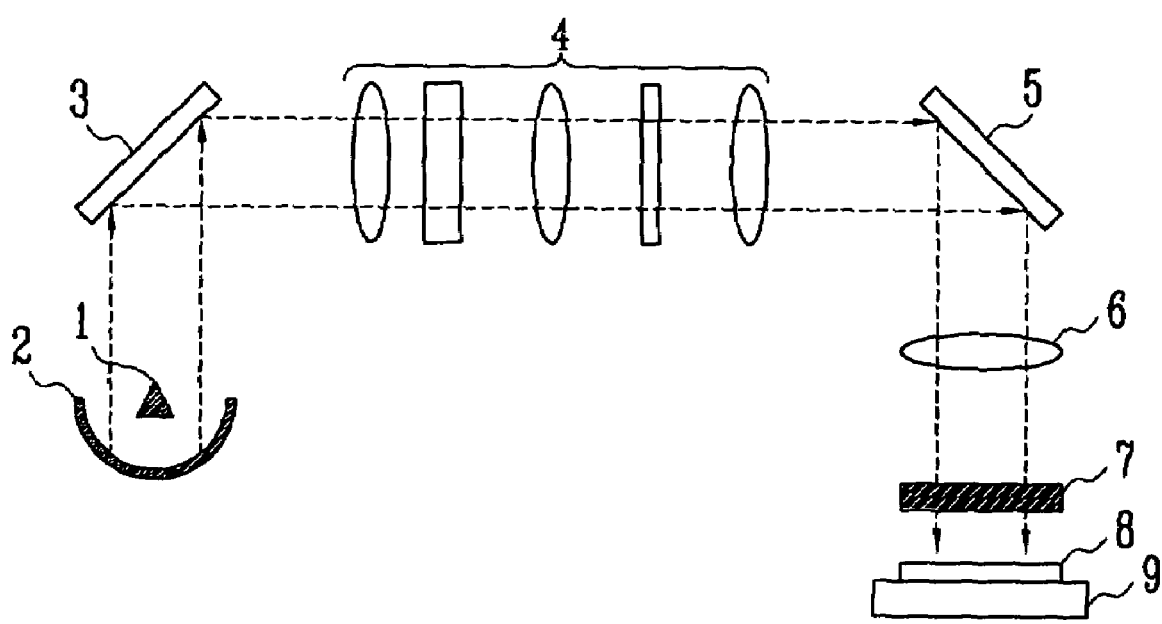
FIG. 1 is a schematic view of a conventional exposure apparatus.
Figure 2:
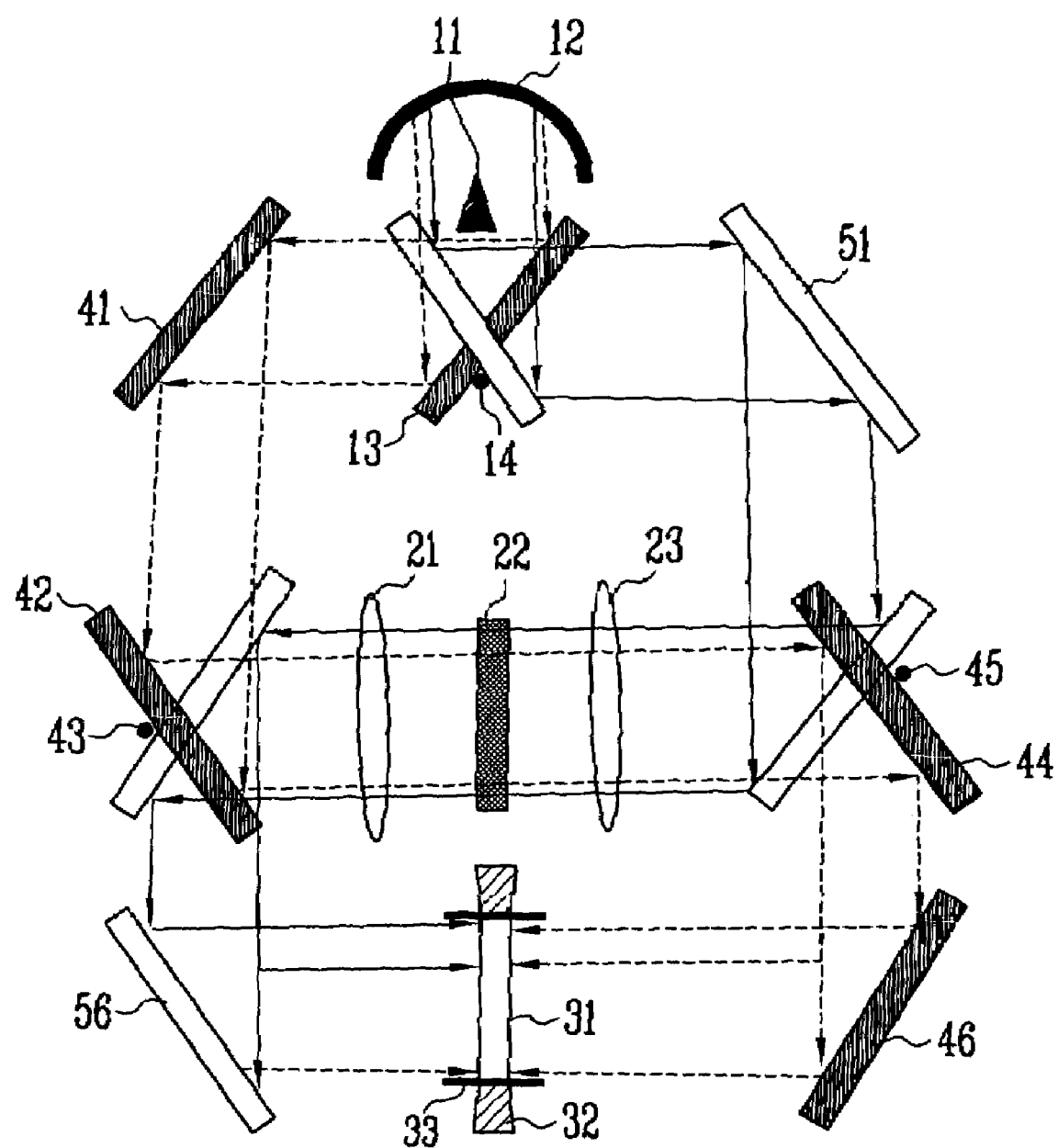
FIG. 2 is a schematic view of an exposure apparatus in accordance with an exemplary embodiment of the present invention.

FIG. 2 is a schematic view of an exposure apparatus in accordance with an exemplary embodiment of the present invention.

Referring to FIG. 2, the exposure apparatus includes: a light source 11 which provides light for exposure; a mask 22 having a predetermined pattern; a wafer 31 mounted on a holder 32 to be exposed; a reflective mirror 12 for reflecting the light provided from the light source 11; an optical path changer 13 for changing an optical path provided from the reflective mirror 12; mirrors 41 and 51 installed at both sides of the optical path changer 13 to change the optical path; mirrors 46 and 56 installed at both sides of the wafer 31 to change the optical path; mirrors 42 and 44 installed at both sides of the mask 22 to enter the light reflected by the mirrors 41 and 51 into the mask 22 and to enter the light passed through the mask 22 into the mirrors 46 and 56; and lenses 21 and 23 installed between the mask 22 and the mirrors 42 and 44, respectively.

The optical path changer 13 is composed of a mirror or a beam splitter formed of one reflective surface or a pair of reflective surfaces, and includes a rotary means 14 for rotating the optical path changer 13 to change the optical path. In addition, the mirrors 42 and 44 include rotary means 43 and 45 for entering the light reflected by the mirrors 41 and 51 into the mask 22, or entering the light passed through the mask 22 into the mirrors 46 and 56.

While each of the mirrors 42 and 44 includes one reflective surface or a pair of reflective surfaces and each of the mirrors 41, 46, 51 and 56 includes one reflective surface, the mirrors may be variously modified depending on the constitution or use. When the mirror has a pair of reflective surfaces, an axis of the rotary means should be located at a center of the mirror, and when the mirror has one reflective surface, the axis of the rotary means should be located at a lower part of a rear surface of the mirror.

The wafer 31 is fixed to the holder 32 at its edges to allow an angle of the wafer 31 to be easily adjusted using a laser alignment apparatus so that the light can be perpendicularly entered into the wafer 31 always. In addition, a guide ring 33 having a lens barrel shape and a black inner surface is installed around the wafer 31 to minimize diffraction or blur of the light entered into the wafer 31, or exposure of the other surface due to the diffracted light.

Hereinafter, an operation of the exposure apparatus in accordance with the present invention will be described.

The light provided from the light source 11 is reflected by the reflective mirror 12 to be entered into the optical path changer 13. The optical path changer 13 is configured to be rotated bi-directionally by 90 degrees using the rotary means 14 to thereby change the optical path provided from the light source 11 in the right or left direction.

First, it will be described when the optical path is changed in the left direction by the optical path changer 13.

The light changed in the left direction by the optical path changer 13 is perpendicularly reflected by the mirror 41, and then perpendicularly re-reflected by the mirror 42 to be entered into the mask 22 through the lens 21. The light passed through the mask 22, i.e., an optical pattern formed by the mask 22 is entered into the mirror 44 through the lens 23, perpendicularly reflected by the mirror 44, and then perpendicularly re-reflected by the mirror 46 to be irradiated to the wafer 31.

Next, it will be described when the optical path is changed in the right direction by the optical path changer 13.

In a state that the optical path changer 13 is perpendicularly rotated by driving the rotary means 14 and the mirrors 42 and 44 are perpendicularly rotated by driving the rotary means 43 and 45, the light changed in the right direction by the optical path changer 13 is perpendicularly reflected by the mirror 51, and then perpendicularly re-reflected by the mirror 44 to be entered into the mask 22 through the lens 23. The light passed through the mask 22, i.e., an optical pattern formed by the mask 22 is entered into the mirror 42 through the lens 21, perpendicularly reflected by the mirror 42, and then perpendicularly re-reflected by the mirror 56 to be irradiated to the wafer 31.

While the embodiment describes the case that the wafer is vertically mounted for the convenience of description, the wafer may be horizontally mounted, and the mirrors, lenses, and mask may be arranged corresponding to the position of the wafer. In this case, optical intensity should be equally maintained, and the optical path should have the minimum difference. Using the laser alignment apparatus, a positioner may be manipulated to precisely adjust the wafer vertically, horizontally, or to a desired angle.

As can be seen from the foregoing, the exposure apparatus in accordance with the present invention is capable of continuously exposing one surface, both surfaces or a specific surface of a wafer in a state that the wafer is once aligned, by bi-directionally changing an optical path using an optical path changer and selectively adjusting the optical path using a rotary means. Therefore, it is possible to easily expose the both surfaces of the wafer without re-mounting the wafer, and to prevent the wafer from being damaged during a wafer mounting process and the number of the processes from increasing.

In addition, the exposure apparatus in accordance with the present invention is capable of preventing a surface of the wafer from being damaged during a process of fabricating a micro-machine (MEMS), a display, a detection sensor, and so on, and readily performing the exposure process to both surfaces of the wafer. Further, the present invention can be applied to various semiconductor device manufacturing processes requiring advanced fusion technology.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An exposure apparatus comprising:
   a light source;
   a mask having a predetermined pattern;
   a material mounted on a holder to be exposed;
   a reflective mirror for reflecting light provided from the light source;
   an optical path changer for changing a path of the light provided from the reflective mirror;
   first mirrors installed at both sides of the optical path changer to change the path of the light;
   second mirrors installed at both sides of the material to change the path of the light; and
   third mirrors installed at both sides of the mask to enter the light reflected by the first mirrors into the mask and to enter the light passed through the mask into the second mirrors.

2. The exposure apparatus according to claim 1, further comprising lenses installed between the mask and the third mirrors, respectively.

3. The exposure apparatus according to claim 1, wherein the optical path changer is composed of a mirror or a beam splitter having one reflective surface or a pair of reflective surfaces.

4. The exposure apparatus according to claim 1, further comprising a rotary means for rotating the optical path changer to change the path of the light.

5. The exposure apparatus according to claim 1, further comprising a rotary means for rotating the third mirrors to enter the light reflected by the first mirrors into the mask or to enter the light passed through the mask into the second mirrors.

6. The exposure apparatus according to claim 1, wherein each of the first and second mirrors has one reflective surface, and each of the third mirrors has a pair of reflective surfaces.

7. The exposure apparatus according to claim 1, wherein the material is mounted on the holder at its edges.

8. The exposure apparatus according to claim 1, further comprising a guide ring installed around the material to prevent diffraction or blur of light.

* * * * *